United States Patent [19]
Hirooka et al.

[11] Patent Number: 5,910,342
[45] Date of Patent: Jun. 8, 1999

[54] PROCESS FOR FORMING DEPOSITION FILM

[75] Inventors: Masaaki Hirooka, Toride; Kyosuke Ogawa, Tokyo; Shunichi Ishihara, Ebina; Isamu Shimizu, Yokohama, all of Japan

[73] Assignee: Canon Kabushiki Kaisha, Tokyo, Japan

[21] Appl. No.: 08/469,676

[22] Filed: Jun. 6, 1995

Related U.S. Application Data

[62] Division of application No. 08/280,561, Jul. 25, 1994, abandoned, which is a continuation of application No. 08/101,285, Aug. 3, 1993, abandoned, which is a continuation of application No. 07/913,755, Jul. 17, 1992, abandoned, which is a continuation of application No. 07/714,988, Jun. 14, 1991, abandoned, which is a continuation of application No. 07/305,546, Feb. 3, 1989, abandoned, which is a division of application No. 07/161,386, Feb. 22, 1988, Pat. No. 4,835,005, which is a continuation of application No. 06/889,906, Jul. 28, 1986, abandoned, which is a continuation of application No. 06/641,021, Aug. 15, 1984, abandoned.

[30]    Foreign Application Priority Data

Aug. 16, 1983  [JP]  Japan ................................ 5-149366
Aug. 17, 1983  [JP]  Japan ................................ 5-149758
Aug. 18, 1983  [JP]  Japan ................................ 5-151027

[51] Int. Cl.$^6$ .............................. B06D 3/06; C23C 16/00
[52] U.S. Cl. ...................... 427/573; 427/574; 427/578; 427/580; 427/255; 427/255.1; 427/255.2; 427/314; 427/255.5; 430/128
[58] Field of Search .................................. 427/569, 578, 427/571, 580, 573, 574, 255, 255.2, 255.1, 248.1, 314, 255.5; 430/128; 118/719, 729

[56]              References Cited
             U.S. PATENT DOCUMENTS 4,430,149  2/1984  Berkman .............................. 427/255.5
4,479,455  10/1984 Doehler et al. ........................ 427/569
4,702,934  10/1987 Ishihara et al. ........................ 118/50.1

*Primary Examiner*—Roy V. King
*Attorney, Agent, or Firm*—Fitzpatrick, Cella, Harper & Scinto

[57]                ABSTRACT

A process for forming a deposition film on a substrate comprises introducing separately a precursor or activated species formed in a decomposition space (B) and activated species formed in a decomposition space (C), into the deposition space wherein the film is formed on the substrate.

16 Claims, 2 Drawing Sheets

PROCESS FOR FORMING DEPOSITION FILM

This application is a division of application Ser. No. 08/280,561, filed Jul. 25, 1994, now abandoned; which in turn, is a continuation of application Ser. No. 08/101,285, filed Aug. 3, 1993, now abandoned; which in turn, is a continuation of application Ser. No. 07/913,755, filed Jul. 17, 1992, now abandoned; which in turn, is a continuation of application Ser. No. 07/714,988, filed Jun. 14, 1991, now abandoned; which in turn is a continuation of application Ser. No.07/305,546, filed Feb. 3, 1989, now abandoned; which in turn is a division of application Ser. No. 07/161,386, filed Feb. 22, 1988, now issued as U.S. Pat. No. 4,835,005; which in turn, is a continuation of application Ser. No. 06/889,906, filed Jul. 28, 1986, now abandoned; which in turn is a continuation of application Ser. No. 06/641,021, filed Aug. 15, 1984, now abandoned.

BACKGROUND OF THE INVENTION

1. Field of the Invention

The present invention relates to a process for forming functional films, particularly deposition useful for various purposes, specially for semiconductor devices and electrophotographic photosensitive devices.

2. Description of the Prior Art

A number of possible processes have been disclosed up to now for forming deposition films. For instance, for producing tilms of amorphous silicon deposit, there have been tried the vacuum deposition process, plasma CVD process, CVD process, reactive sputtering process, ion plating process and photo-CVD process, etc. Generally, the plasma CVD process is industrialized and widely used for this purpose.

However, deposition films of amorphous silicon still admit of improvements in overall characteristic including electric and optical properties, various characteristics to fatigue due to repeated uses or to environmental use conditions, and additionally productivity including product uniformity, reproducibility, and mass-producivity.

The conventional plasma CVD process, as compared with the conventional CVD process, is complicated in the reaction process to deposit amorphous silicon and involves many unknown things in the reaction mechanism. The film formation in the plasma CVD process is affected by a number of parameters (e.g. substrate temperature, flow rates and mixing ratio of feed gases, pressure during film formation, high-frequency power used, electrode structure, structure of deposition chamber, rate of evacuation, and plasma generation method). These various parameters, combined with one another, cause sometimes an unstable plasma, which exerts marked adverse effects on the deposited film. In addition, the parameters characteristic of the deposition apparatus must be determined according to the given apparatus, so that it is difficult in practice to generalize the production conditions.

The conventional plasma CVD process is regarded at the present time as the best method for the purpose of obtaining amorphous silicon films which have such electrical and optical properties as to fulfill various application purposes.

However, it is necessary in certain applications of the deposition film to realize reproducible mass production thereof while satisfying needs for the film of a large area, uniform thickness, and uniform quality. In consequence, much investment is required for the mass production equipment, the administration items for the mass production become complicated, tolerances in quality control become narrow, and the regulation and adjustment of equipment becomes delicate. These matters in the production of amorphous silicon deposit films by the plasma CVD process are pointed out as the problems to be solved in the future.

On the other hand, the conventional CVD process requires a high operational temperature and has not given the deposition film having such characteristics that the film can be used practically.

Thus there is an intensive need for a process for producing amorphous silicon films which, as stated above, realizes mass production thereof at a low equipment cost while securing practically acceptable characteristics and uniformity of the films.

The above stated matters also apply to other functional films, e.g. silicon nitride, silicon carbide, and silicon oxide films.

SUMMARY OF THE INVENTION

An object of the invention is to provide a novel process for forming deposition films which is free of the above noted drawbacks of the plasma CVD process.

Another object of the invention is to provide a process by which deposition films of good characteristics can be formed at an improved deposition rate without uitlizing plasma reaction in the deposition space (A) for the film formation and additionally the simplification of controlling the film formation conditions and mass production of the films can be achieved with ease.

According to an aspect of the invention, there is provided a process for forming a deposition film on a substrate which comprises introducing separately a precursor formed in a decomposition space (B) and activated species formed in another decomposition space (C), into the deposition space (A) wherein the film is formed on the substrate.

According to another aspect of the invention, there is provided a process for forming a deposition film on a substate which comprises introducing separately activated species formed in a decomposition space (B) and activated species formed in another decomposition space (C), into the deposition space (A) wherein the film is formed on the substrate.

According to a further aspect of the invention, there is provided a process for forming a deposition film on a substrate which comprises introducing separately activated species (a) which are prepared by decomposing a silicon halide represented by the formula $Si_nX_{2n+2}$ (n=1, 2, ...) and a mixture of activated species of hydrogen with activated species (b) represented by the formula $Si_mH_{2m-x}$ (m=1, 2, ..., x=1, 2, ...), the mixture being prepared by decomposing a higher, straight chain silane compound, into the deposition space (A) wherein the film is formed on the substrate.

According to still another aspect of the invention, there is provided a process for forming a deposition film on a substrate which comprises introducing separately activated species (a) which are prepared by decomposing a silicon halide represented by the formula $Si_nX_{2n+2}$ (n=1, 2, ...) and a mixture of activated species of hydrogen with activated species (b), the mixture being prepared by decomposing a cyclic silane compound, into the deposition space (A) wherein the film is formed on the substrate. As employed herein, n, m, and x are each integers of at least 1.

DETAILED DESCRIPTION OF PREFERRED EMBODIMENTS

Figure 1:
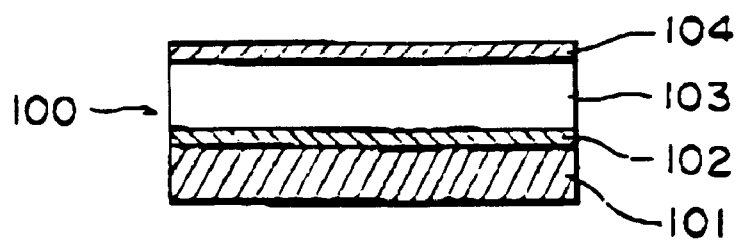
FIG. 1 is a schematic diagram illustrating the layer structure of an embodiment of the photoconductive member prepared according to the process of the invention.

In the process of the invention, the parameters affecting the formation of deposition films are amounts of a precursor and activated species introduced into the deposition space (A), temperatures of the substrate and the space (A), and pressure therein, since no plasma is formed therein. Accordingly, the formation of deposition films is easy to control, and reproducible films can be mass-produced.

The term "precursor" herein means an intermediate that is formed prior to the ultimate product (a material constituting the deposition film) and will be converted completely or partly into a material constituting the ultimate product, though having, in the intact energy state, no or little ability to form the deposition film.

The term "activated species" herein means chemical species, for example, radicals or ions which lie in high energy states and will act chemically one upon another to form a deposition film on a substrate or will undergo chemical interaction or reaction with molecules of the precursor to give energy thereto, for instance, and thereby will bring the precursor to such states as to form a deposition film. Accordingly the activated species in the former case needs to contain a constituent which will be converted into a constituent of the deposition film, while the activated species in the latter case may or may not contain such a constituent.

In the invention, the precursor or activated species to be introduced from the decomposition space (B) into the deposition space (A) are selected as desired from those of lifetimes, in the case of the precursor, of at least desirably 0.01 sec., preferably 0.1 sec. particularly preferably 1 sec., and in the case of the activated species, of at least desirably 1 sec., preferably 10 sec., particularly preferably 150 sec. Constituents of the precursor or of the activated species are converted into main constituents of the deposition film to be formed in the deposition space (A).

When a precursor is introduced from the decomposition space (B), the activated species to be introduced from the decomposition space (c) is selected from those of lifetimes of up to desirably 10 sec., preferably 8 sec., particularly preferably 5 sec. This activated species undergoes chemical interaction in the deposition space (A) with the precursor introduced at the same time from the decomposition space (B) to the deposition space (A), which precursor contains a constituent that will become main constituent of the intended deposition film. Thus, a desired deposition film is readily formed on a given substrate.

When an activated species is introduced from the decomposition space (B), the activated species to be introduced from the decomposition space (C) is of short lifetimes. The activated species undergoes chemical interaction in the deposition space (A) with the activated species introduced at the same time from the decomposition (B) to the deposition space (A), which contains a constituent that will become main constituent of the resulting deposition film. Thus an intended deposition film is readily formed on a given substrate.

According to the process of the invention, the deposition film formed without generation of any plasma in the deposition space (A) suffers from no substantial adverse effect of the etching action or some other action, e.g. abnormal discharge action. In addition, more stable production of deposition films becomes possible according to the process of the invention, which is an improved CVD process, by controlling the atmospheric temperature of the deposition space (A) and the temperature of the substrate, as desired.

A difference of the process of the invention from the conventional CVD process is to use a precursor and activated species which have been produced in advance in spaces other than the deposition space (A). In this way, the process of the invention has been markedly improved in the film deposition rate over the conventional CVD process. Additionally, the substrate temperature during film deposition can be further lowered. Thus, deposition films of definite quality can be produced industrially in a large volume and at a low cost.

The formation of activated species in the decomposition space (C) can be accomplished by exciting the charged material with not only any of suitable energies including electric discharge energy, light energy, thermal energy, and combined energies of these but also a heterogeneous or homogeneous catalyst.

The material to be fed into the decomposition space (B) is a compound containing at least one silicon atom which combines with a highly electron attractive atom or atomic group, or polar group. Such compounds may include, for example, $Si_nX_{2n+2}$ (n=1, 2, 3, . . . , X=F, Cl, Br, I), $(SiX_2)_n$ (n≧3, X=F, Cl, Br, I), $Si_nHX_{2n+1}$ (n=1, 2, 3, . . . , X=F, Cl, Br, I), and $Si_nH_2X_{2n}$ (n=1, 2, 3, . . . , X=F, Cl, Br, I). Individual examples of these compounds are $SiF_4$, $Si_2F_6$, $Si_3F_8$, $Si_2Cl_6$, $Si_2Cl_3F_3$, $(SiF_2)_5$, $(SiF_2)_6$, $(SiF_2)_4$, $SiHF_3$, $SiH_2F_2$, $SiCl_4$, $(SiCl_2)_5$, $SiBr_4$, and $(SiBr_2)_5$, which are gaseous at ordinary temperature or readily gasifiable compounds. $SiH_2(C_6H_5)_2$, $SiH_2(CN)_2$ and the like are also used depending upon application purposes of the deposition film. A precursor or activated species are formed by applying energy for decomposition such as thermal energy, light energy, or electric discharge energy to the above-cited compound in the decomposition space (B). The precursor or activated species are introduced into the deposition space (A). The precursor to be introduced desirably need to have a lifetime of at least 0.01 sec. By introducing such a precursor into the deposition space (A), the activating reaction thereof with the activated species introduced from the decomposition space (C) is made more effective and the deposition efficiency and deposition rate are increased, where thermal, light or other energy is applied if necessary onto the substrate or to the atmosphere in the deposition space (A) without using such electric discharge energy as to form plasma. Thus the formation of a desired deposition film is accomplished.

The activated species introduced from the decomposition chamber (B) need to have lifetimes of at least 1 sec., preferably 10 sec., particularly preferably 150 sec. With these active species, the formation of a desired deposition film is accomplished similarly to the case with the precursor stated above.

Feed materials for preparing activated species in the decomposition space (C) may include, for example; $H_2$, $SiH_4$, $SiH_3F$, $SiH_3Cl$, $SiH_3Br$, $SiH_3I$ and the like; higher silane compound such as $Si_2H_6$, $Si_3H_8$, $Si_4H_{10}$ and the like; branched chain silane compound such as $SiH_3.SiH(SiH_3)$ $SiH_2.SiH_3$ and the like; cyclic silane compound such as $(SiH_2)_5$, $(SiH_2)_4$, $(SiH_2)_6$, $(SiH_2)_5.SiH.SiH_3$ and the like; and rare gas such as He, Ar, and the like. These materials may be used singly or in combination.

The amount ratio of feeding to the deposition space (A) of the precursor or activated species from the decomposition space (B) to the activated species from the decomposition space (C) is chosen appropriately depending upon the deposition conditions and the kinds of activated species. The ratio is generally 10.1–1:10, preferably 8:2–4:6 (flowrate ratio).

For producing the precursor or activated species in the decomposition space (B) or (C), electric discharge energy, thermal energy, light energy, or some other energy is used as excitation energy in consideration of operating conditions and equipment in individual cases.

When a higher straight chain silane or a cyclic silane is used as the material to be fed into the decomposition space (C), it can be decomposed at a much higher rate and with lower energy and the rate of film deposition can be increased further to a great extent. Accordingly, a steady and high-volume production of deposition films can be accomplished more easily.

Now the invention is illustrated referring to a typical example of electrophotographic image forming members which are produced by the deposition film forming process of the invention.

FIG. 1 shows the structure of such a typical example. The photoconductive member 100 shown in FIG. 1 can be used as an electrophotographic image forming member having a layer structure consisting of a substrate 101 suitable for photoconductive member, an intermediate layer 102 and a surface layer 104 which may be formed as required, and a photoconductive layer 103.

The substrate 101 may be either an electric conductor or an electric insulator. Suitable materials for the conductive substrate are, for example, metals such as NiCr, stainless steel, Al, Cr, Mo, Au, Ir, Nb, Ta, V, Ti, Pt, and Pd and alloys of these metals.

For the insulating substrate there may be employed usually a film or sheet of a synthetic resin, for example, polyester, polyethylene, polycarbonate, cellulose acetate, polypropylene, poly(vinyl chloride), poly(vinylidene chloride), polystyrene, and polyamide, glass, ceramics, paper and the like. It is desirable that at least one side of the insulating substrate be given conductivity by some suitable treatment and then overlaid with other necessary layers. For instance, the surface of the substrate is covered with a thin film of NiCr, Al, Cr, Mo, Au, Tr, Nb, Ta, V, Ti, Pt, Pd, $In_2O_3$, $SnO_2$, or ITO ($In_2O_3+SnO_2$) when the substrate is made of glass; and the surface is treated with a metal, for example, NiCr, Al, Ag, Pb, Zn, Ni, Au, Cr, Mo, Ir, Nb, Ta, V, Ti, or Pt by vacuum deposition, electron-beam vapor deposition, sputtering or the like or laminated with a foil of the above metal when the substrate is a synthetic resin film such as a polyester film. The shape of the substrate is free to select as desired from cylindrical form, belt form, plate form, etc. For example, the substrate to be used for an electrophotographic image forming member for high-speed continuous copying is desired to be in endless belt form or hollow cylindrical form.

The intermediate layer 102 comprises, for example, a non-photoconductive amorphous material containing silicon atom and any of carbon, nitrogen, oxygen, and halogen atoms. This layer has the function of preventing effectively the inflow of charge carriers into the photoconductive layer 103 from the substrate 101 side and facilitating the passage from the photoconductive layer 103 side to the substrate 101 side, of photocarriers which are produced in the photoconductive layer 103 by irradiating it with electromagnetic waves and move toward the substrate 101.

When the intermediate layer 102 is formed, a continuous operation is possible up to the formation of the photoconductive layer 103. In this case, starting gases for forming the intermediate layer 102, each mixed if necessary with a diluent gas such as He or Ar, are fed into prescribed decomposition spaces (B) and (C), respectively. Then, necessary excitation energies are applied to the gases in the spaces, respectively, to produce a precursor or activated species in the space (E) and activated species in the space (C). These are introduced into a deposition space (A) wherein the substrate 101 is set in advance, and the intended intermediate layer 102 is formed on the substrate 101, if necessary, by applying further energy for film formation to the introduced gases.

Effective materials as the feed to the decomposition space (C) for producing activated species to form the intermediate layer 102 are as follows; Ar, He, $H_2$, $SiH_4$; hydrogen-rich halogenated silanes, e.g. $SiH_3Cl$, $SiH_3F$, and $SiH_3Br$; higher straight chain silanes, e.g. $Si_2H_6$, $Si_3H_8$, and $Si_4H_{10}$; cyclic silanes, e.g. $(SiH_2)_5$ and $(SiH_2)_4$; and mixtures of cyclic silane, hydrogen and higher straight chain silane; gaseous or gasifiable nitrogen compounds such as nitrogen, nitride and azide, e.g. $N_2$, $NH_3$, $H_2N.NH_2$, $HN_3$, and $NH_4N_3$; $C_1$–$C_5$ saturated hydrocarbons, e.g. methane, ethane, propane, n-butane, and pentane; $C_2$–$C_5$ ethylenic hydrocarbons, e.g. ethylene, propylene, butene-1, butene-2, isobutylene, and pentene; $C_2$–$C_4$ acetylenic hydrocarbons, e.g. acetylene, methylacetylene, and butyne; and oxygen compounds, e.g. $O_2$, $O_3$, CO, $CO_2$, NO, $NO_2$, and $N_2O$.

The starting material for forming the intermediate layer 102 is selected appropriately from the above-cited compounds so that prescribed atoms will be contained as constituents in the resulting intermediate layer 102.

On the other hand, effective materials as the feed to the decomposition space (B) for producing a precursor or activated species to form the intermediate. layer 102 are, for example, $SiF_4$ and $SiH_2F_2$, which at elevated temperature readily produce a precursor such as $SiF_2$ having a long lifetime or activated species.

The thickness of the intermediate layer 102 is desirably 30–1000 Å, preferably 50–600 Å.

The photoconductive layer 103 comprises an amorphous silicon, a-SiX(H), which comprises silicon atoms as the matrix and contains halogen atoms (X) and, if necessary, hydrogen atoms (H) so as to possess such photoconductive characteristics that the resulting member can exhibit sufficient functions as an electrophotographic image forming member.

For the formation of the photoconductive layer 103, a starting gas such as $SiF_4$ or $Si_2H_2F_2$ is fed, similarly to the case of the intermediate layer 102, into the decomposition space (B) and decomposed at an elevated temperature to produce a precursor or activated species. This precursor or these activated species are introduced into the deposition space (A). Into the decomposition space (C),Ion the other hand, a starting gas such as $H_2$, $SiH_4$, $SiH_3F$, $Si_2H_6$, $Si_3H_8$, $(SiH_2)_5$, $(SiH_2)_4$, $(SiH_2)_6$, or mixture of these compounds is fed and excited with a prescribed energy to produce activated species. These activated species are introduced into the deposition space (A) and undergo chemical interaction with the precursor or activated species introduced thereinto from the decomposition space (B), to deposit the intended photoconductive layer 103 on the intermediate layer 102.

Generally the thickness of the photoconductive layer 103 is chosen appropriately according to the application purpose of the end product. The thickness of the photoconductive layer 103 shown in FIG. 1 is chosen appropriately in relation to the thickness of the intermediate layer 102 so as to enable the two layers to exhibit respective functions effectively. In general, the thickness of the photoconductive layer 103 is desired to be hundreds-thousands times or more as large as that of the intermediate layer 102. Absolute values of the suitable thickness of the photoconductive layer 103 are preferably 1–100$\mu$, more preferably 2–50$\mu$.

The content of each of H and X (X is halogen atom such as F) in the photoconductive layer 103 is desirably 1–40 atomic %, preferably 5–30 atomic %.

The surface layer 104 shown in FIG. 1 may be formed, if necessary, similarly to the intermediate layer 102 or the photoconductive layer 103. For making the surface layer 104 of silicon carbide, a starting gas, e.g. $SiF_4$, is fed into the decomposition space (B) and a starting gas, e.g. a $SiH_4/CH_4/H_2$ mixture, $SiH_4/SiH_2(CH_3)_2$ mixture, $Si_2H_6/CH_4/H_2$ mixture, $Si_2H_6/SiH_2(CH_3)_2$ mixture, $(SiH_2)_5/CH_4/H_2$ mixture, or $(SiH_2)_5/SiH_2(CH_3)_2$ mixture, is fed into the decomposition space (C). The gas introduced into each space is decomposed with excitation energy into a precursor or activated species in the respective spaces and separately introduced into the deposition space (A) to deposit the intended surface layer 104 on the photoconductive layer 103.

A preferred example of the surface layer 104 is a deposition film, such as a silicon nitride film or silicon oxide film, having a wide band gap. It is also possible to change the film composition continuously from the photoconductive layer 103 to the surface layer 104. The thickness of the surface layer 104 is in the range of desirably 0.01 to 5$\mu$, preferably 0.05 to 1$\mu$.

For making the photoconductive layer 103 of n-type or p-type as required, during the layer formation, it is doped with a n-type impurity, or p-type impurity, or both impurities while controlling the doping content.

Suitable p-type impurites for the doping are elements of group III-A of the periodic table, e.g. B, Al, Ga, In, and Tl. Suitable n-type impurities are elements of group V-A of the periodic table, e.g. N, P, As, Sb, and Bi, among which B, Ga, P, and Sb are best suited.

Suitable contents of the doping in the photoconductive layer 103 are determined according to the electric and optical characteristics required for the layer. In the case of elements of group III-A of the periodic table, the suitable contents thereof are $3 \times 10^{-2}$ atomic % and less, and in the case of elements of group V-A, the suitable contents thereof are $5 \times 10^{-3}$ atomic % and less.

The doping of the photoconductive layer 103 with an impurity can be accomplished by feeding a starting material for introducing the doping impurity in the gaseous state into the decomposition space (B) or (C) at the time of the formation of the layer. Preferably, the material is fed not into the space (B) but into the space (C), from which activated species are introduced into the deposition space (A).

Suitable starting materials for the doping impurity are compounds which are gaseous at ordinary temperature and pressure or at least readily gasifiable under the conditions of forming the layer. Examples of such starting materials are $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, and $AlCl_3$.

EXAMPLE 1

Figure 2:
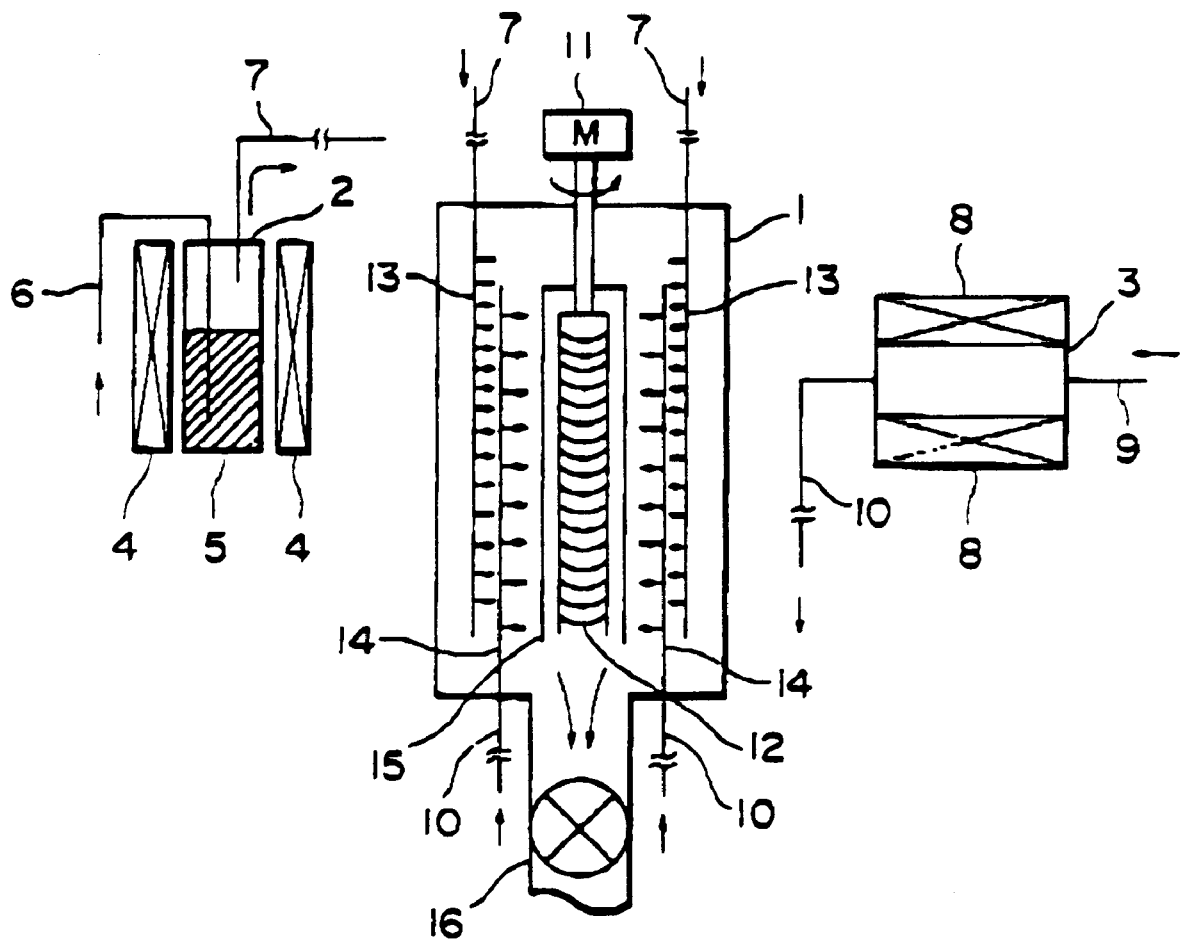
FIG. 2 is a schematic illustration showing an example of the device to carry out the process of the invention.

Using an apparatus as shown in FIG. 2, a drum type of electrophotographic image forming member was prepared in the following manner.

In FIG. 2, numerals denote the following: 1: a deposition space (A), 2: a decomposition space (B), 3: a decomposition space (C), 4; an electric furnace, 5: solid Si grains, 6: an inlet pipe for feeding a starting material for a precursor, 7: a conduit for the precursor; 8: an electric furnace, 9: an inlet pipe for a starting material for activated species, 10: an conduit for the activated species, 11: a motor, 12: a heater, 13: a precursor blowoff pipe, 14: an activated species blowoff pipe, 15: an Al cylinder, and 16: an exhaust valve.

An Al cylinder 15 was suspended in the deposition space (A) 1. The heater 12 was set inside the cylinder so that it may be rotated by the motor 11.

The apparatus comprises the conduit 7 for introducing the precursor from the decomposition space (B) 2, the blowoff pipe 13 for the precursor, the conduit 10 for introducing the activated species from the decomposition space (C) 3 and the blowoff pipe 14 for the activated species.

The solid Si grains 5 filled in the decomposition space (B) 2 were melted by heating with the electric furnace 4. While keeping the temperature of the Si melt at 1100° C., $SiF_4$ was blown thereinto from a bomb through the inlet pipe 6 to form a precursor $SiF_2$. The $SiF_2$-containing gas was then introduced into the deposition space (A) 1 through the conduit 7 and the blowoff pipe 13.

On the other hand, $SiH_4$ and $H_2$ were fed into the decomposition space (C)3 through the inlet pipe 9, and heated at 600° C. with the electric furnace 8 to form activated species such as $SiH_2$, $SiH$, $SiH_3$, and H. The activated species-containing gas was introduced into the deposition space (A) 1 through the conduit 10 and the blowoff pipe 14. Herein the length of the conduit 10 had been designed as short as possible to minimize the deactivation of the activated species during the passage therethrough. The Al cylinder in the deposition space (A) is heated at 300° C. by the heater 12 and rotated. The waste gas was discharged through the exhaust valve 16. Thus a 20-$\mu$ thick photoconductive layer 103 was formed. Similarly, an intermediate layer 102 and surface layer 104 were formed.

EXAMPLE 2

An amorphous silicon deposition film was formed by the conventional plasma CVD process using an apparatus as shown in FIG. 2, the deposition space (A) of which was provided with a 13.56-MHz high-frequency electric discharge unit. At that time, $SiF_4$, $SiH_4$ and $H_2$ were employed.

EXAMPLE 3

An electrophotographic image forming member in the drum form was prepared in the same manner as in Example 1 except that, for the formation of the photoconductive layer, $H_2$ was fed, instead of the $SiH_4/H_2$ mixture, into the decomposition space (C)3 and a plasma reaction was caused to take place by a 13.56-MHz high-frequency electric discharge without heating with the electric furnace so that the hydrogen plasma state was produced. The activated species of H was introduced into the deposition space (A) through the blowoff pipe 14.

The preparation conditions and performance of the electrophotographic image forming member in the drum form obtained in Examples 1, 2 and 3 are shown in Table 1.

In Examples 1 and 3, the intermediate layer 102 (2000 Å thick) was formed in such a manner that $SiF_4$ and $SiH_4/H_2/NO/B_2H_6$ (No 2% and $B_2H_6$ 0.2% by vol. %) were introduced into the decomposition spaces (B) and (C), respectively, and the precursor and activated species were produced with the respective excitation energies and introduced into the deposition space (A).

Also, in Example 2, the intermediate layer (2000 Å thick) was formed by the plasma CVD process employing a gas mixture of $SiH_4/H_2/NO/B_2H_6$ of the same composition as that in Examples 1 and 3.

In Examples 1 and 3, the surface layer 104 (1000 Å thick) was formed in such a manner that $SiF_4$ was introduced into the decomposition space (B) while $SiH_4/CH_4/H_2$ was introduced in volume ratio of 10:100:50 into the decomposition space (C), and the precursor and activated species were produced with the respective excitation thermal energies and introduced into the deposition space (A).

Also in Example 2, the plasma CVD process was carried out employing $SiH_4/CH_4/H_2$ of the same composition as above to form the surface layer 104 (1000 Å thick).

Electrophotographic image forming drums prepared in Examples 1, 2, and 3 were each set in a copying machine of Carlson process type comprising the positive charging, image exposure, development with a negative toner, image transfer, and heat fixing, and A3-size copies of black image, white image and gray image were made. Irregularities on the resulting images were examined and expressed by the average number of image defects. The uniformity of charged potential on the cylinder surface in the circumferential and axial directions was also evaluated. Results thereof are shown in Table 1.

EXAMPLE 4

Figure 3:
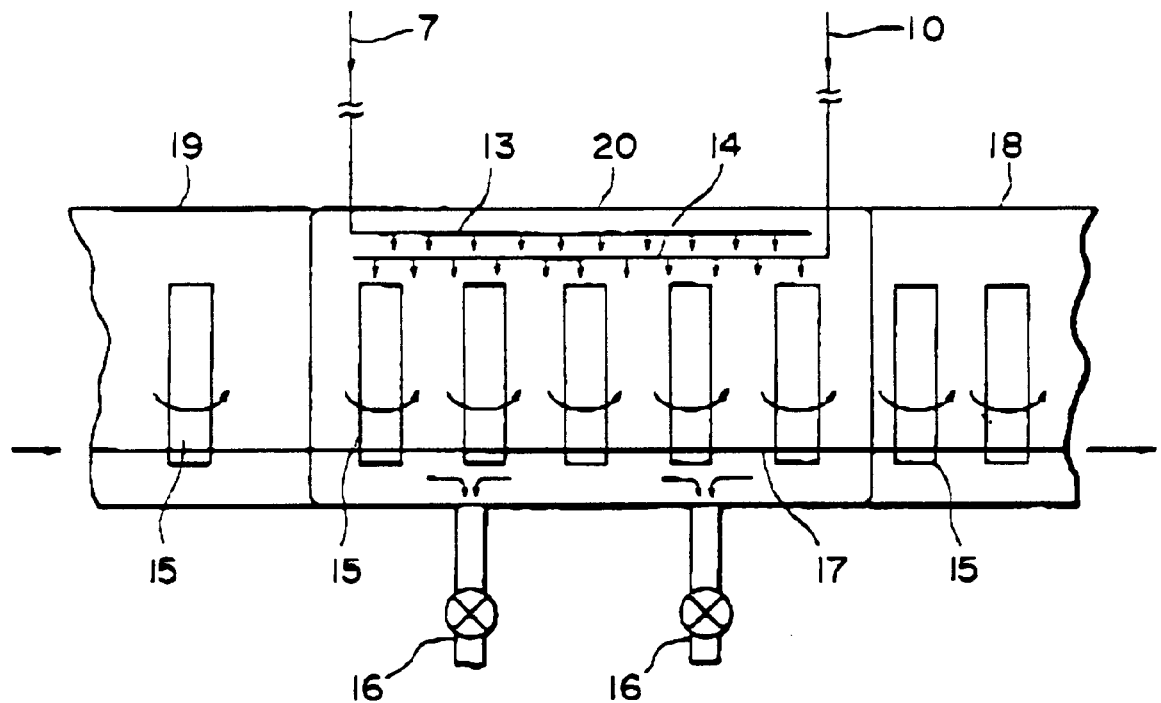
FIG. 3 is a schematic diagram of an arrangement which will permit industrial mass production of deposition films according to the process of the invention.

Using an apparatus as shown in FIG. 3, electrophotographic image forming members in drum form were prepared under similar conditions as in EXAMPLE 1.

In FIG. 3, numerals 7, 10, 13, 14, 15, and 16 have the same meaning as in FIG. 2, and 17 denotes a movable stand provided with rotating means, 18 a cooling space, 19 a heating space, and 20 a deposition space.

As shown in FIG. 3, the apparatus employed in this example comprised a heating chamber 19, deposition chamber 20, and cooling chamber 18. Al cylinders 15 were placed on the movable stand 17 provided with rotating means. In the apparatus, a number of Al cylinders could be treated at once in one deposition space to produce electrophotographic image forming members in the drum form continuously.

It has been confirmed that electrophotographic image forming members in the drum form having uniform and reproducible deposition films can be mass-produced at a low cost by controlling the temperatures of the deposition space and of the Al cylinders and the flow amounts of the precursor-containing gas blown out from the pipe 13 through the conduit 7 from the decomposition space (B) and of the activated species-containing gas blown out from the pipe 14 through the conduit 10 from the decomposition space (C).

According to the plasma CVD process, such treatment of a number of cylindrical substrates in one deposition space would involve problems in the uniformity of the electric discharge and in synergistic effects of complicated production condition parameters, so that it has been impossible to produce electrophotographic image forming member in the drum form having uniform deposition films with high reproducibility.

EXAMPLE 5

Figure 4:
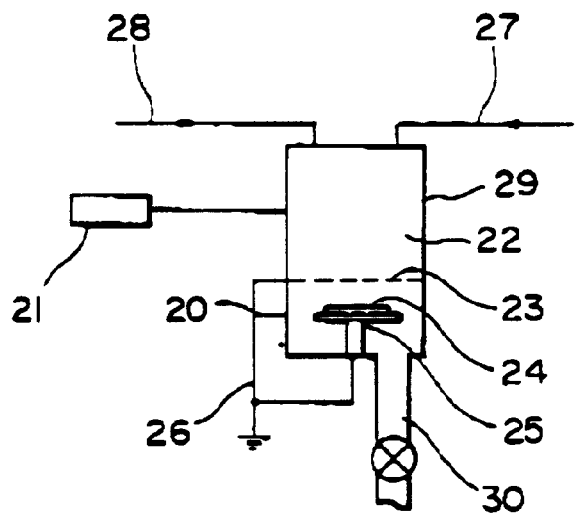
FIG. 4 is a schematic diagram of another example of the device to carry out the process of the invention.

Using an apparatus as shown in FIG. 4, an electrophotographic image forming drum was prepared.

In FIG. 4, numerals denote the following: 20: a deposition space, 21: a high-frequency power source (13.56 MHz), 22: a plasma space, 23: a 50-mesh stainless steel gauze, 24: a substrate, 25: a support table, 26: an earth for keeping the same potential, 27: a blowoff pipe for a precursor containing gas or activated species-containing gas from a decomposition space (B), 28: a blowoff pipe for an $SiH_4/H_2$ mixture, 29: a deposition space (A), 30: an exhaust valve.

Thus, using the apparatus, which had the decomposition space (C) and the deposition space (A) in the same chamber and separately the decomposition space (B), $SiF_2$ was produced in the decomposition space (B) in the same manner as in Example 1 and the $SiF_2$-containing gas was introduced into the deposition space (A) while as $SiH_4/H_2$ mixture was introduced into the decomposition space (C), where a plasma was generated and reacted with $SiF_2$. The resulting gas was passed through the gauze 23 and amorphous silicon was deposited therefrom on the substrate which was kept at a temperature of 280° C. in the deposition space (A). The deposited photoconductive layer exhibited good characteristics, e.g. a dark conductivity, $V_D$, of $2\times10^{11}\Omega^{-1}$ $cm^{-1}$ and a light conductivity, $V_p$, of $3\times10^{6}\Omega^{-1}cm^{-1}$.

EXAMPLE 6

An electrophotographic image forming member in the drum form was prepared by using an apparatus as shown in FIG. 2.

The photoconductive layer 103 thereof was formed as follows: An Al cylinder 15, suspended in the deposition space (A)1, was rotated and heated at 300° C. by the heater 12 which was set inside the Al cylinder and rotated by the motor 11.

The solid Si grains 5 filled in the decomposition space (B)2 were melted by heating with the electric furnace 4. While keeping the temperature of the Si melt at 1100° C., $SiF_4$ was blown thereinto from a bomb through the inlet pipe 6 to form an activated species of $SiF_2$. The $SiF_2$-containing gas was then introduced into the deposition space (A)1 through the conduit 7 and the blowoff pipe 13.

On the other hand, an $Si_2H_6/H_2$ (vol. ratio 5:5) mixture was fed into the decomposition space (C) 3 through the inlet pipe 9, and heated at 450° C. with the electric furnace 8 to form activated species such as $SiH_2$, SiH, $SiH_3$, and H. The activated species-containing gas was then introduced into the deposition space (A)1 through the conduit 10 and the blowoff pipe 14. Herein the conduit 10 has been designed as short as possible to minimize the deactivation of the activated species during the passage therethrough. Thus, the photoconductive layer 103 ($21\mu$ thick) was formed. The waste gas was discharged through the exhaust valve 16.

Similarly, the intermediate layer 102 and surface layer 104 were formed.

EXAMPLE 7

A photoconductive layer 103 was formed from $SiF_4$, $Si_2H_6$ and $H_2$ by the conventional plasma CVD process using an apparatus as shown in FIG. 2, the deposition space (A)1 of which was provided with a 13.56-MHz high-frequency electric discharge unit.

EXAMPLE 8

A deposition film was formed in the same manner as in Example 6, except that an $SiH_4/Si_3H_8/H_2$ (vol. ratio 2:1:1) mixture was fed as starting gas into the decomposition space (C)3, and a plasma reaction was caused to take place by applying a 13.56-MHz high-frequency electric field to the mixture instead of heating with the electric furnace so that a hydrogen plasma state was produced. The activated species of H and various silanes were introduced to the blowoff pipe 14. In such a manner, an electrophotographic image forming member in the drum form was prepared.

EXAMPLE 9

An electrophotographic image forming member in the drum form was prepared in the same manner as in Example 6, except that, for the formation of the photoconductive layer, $Si_2F_6$ was fed as the starting gas into the decomposition space (B) and an $Si_2H_6/H_2$ (vol. ratio 5:5) mixture was fed into the decomposition space (C) and heated at 450° C. with the electric furnace to produce activated species of hydrogen and of silane.

The preparation conditions and performance of the electrophotographic image forming member in the drum form obtained in Examples 6, 7, 8 and 9 are shown in Table 2.

In Examples 6, 8 and 9, the intermediate layer 102 (2000 Å thick) was formed in such a manner that $SiF_4$ and $Si_2H_6/H_2/NO/B_2H_6$(NO 2% and $B_2H_6$ 0.2% by vol. %) were introduced into the decomposition spaces (B) and (C), respectively, and activated species were produced with the respective excitation energies and introduced into the deposition space (A).

Also, in Example 7, the intermediate layer (2000 Å thick) was formed by the plasma CVD process employing a gas mixture of $Si_2H_6/H_2/NO/B_2H_6$ of the same composition as that in Examples 6, 8 and 9.

In Examples 6, 8 and 9, the surface layer 104 (1000 Å thick) was formed in such a manner that $SiF_4$ was introduced into the decomposition space (B) while $Si_2H_6/CH_4/H_2$ was introduced in volume ratio of 10:100:50 into the decomposition space (C), and activated species were produced with the respective excitation thermal energies and introduced into the deposition space (A).

Also in Example 7, the plasma CVD process was carried out employing $Si_2H_6/CH_4/H_2$ of the same composition as above to form the surface layer 104 (1000 Å thick).

EXAMPLE 10

Using an apparatus as shown in FIG. 3, electrophotographic image forming members in the drum form were prepared continuously under similar conditions as in Example 6.

It has been confirmed that electrophotographic image forming members in the drum form having uniform and reproducible deposition films can be mass-produced at low costs by controlling the temperatures of the deposition space and of the Al cylinders and the flow amounts of the activated species-containing gas from the decomposition space (B) and of the activated species-containing gas from the decomposition space (C) into the deposition space (A).

According to the plasma CVD process, such treatment of a number of cylindrical substrates in one deposition space would involve problems in the uniformity of the electric discharge and in synergistic effects of complicated production condition parameters, so that it has been impossible to produce electrophotographic image forming member in the drum for having uniform deposition films with high reproducibility.

EXAMPLE 11

An electrophotographic image forming member in the drum form was prepared in the same manner as in Example 6 except that, for the formation of the photoconductive layer, a mixture of $SiH_4$ and $H_2$ (vol. ratio 1:1) was used as the starting gas introduced into the decomposition space (C)3 and heated at 600° C. by the electric furnace to produce the activated species of silane and hydrogen. The surface layer 104 and intermediate layer 102 were formed similarly.

Electrophotographic image forming members in the drum form prepared in Examples 6, 7, 8, 9, and 11 were evaluated in the same manner as in the case of Examples 1, 2, and 3. Results thereof are shown in Table 2 together with operational conditions in the formation of the photoconductive layers.

EXAMPLE 12

An electrophotographic image forming member in the drum form was prepared by using an apparatus as shown in FIG. 2.

The photoconductive layer thereof was formed as follows: An Al cylinder 15, suspended in the deposition space (A)1, was rotated and heated at 280° C. by the heater 12 which was set inside the Al cylinder and rotated by the motor 11.

The solid Si grains 5 filled in the decomposition space (B)2 were melted by heating with the electric furnace 4. While keeping the temperature of the Si melt at 1100° C., $SiF_4$ was blown thereinto from a bomb through the inlet pipe 6 to form an activated species of $SiF_2$. The $SiF_2$-containing gas was then introduced into the deposition space (A)1 through the conduit 7 and the blowoff pipe 13.

On other hand, $(SiH_2)_5$ was fed into the decomposition space (C)3 through the inlet pipe 9, and heated at 300° C. with the electric furnace 8 to produce activated species such as $SiH_2$, SiH, $SiH_3$, and H. The activated species-containing gas was then introduced into the deposition space (A)1 through the conduit 10 and the blowoff pipe 14. Herein the conduit had been designed as short as possible to minimize the deactivation of the activated species during the passage therethrough. Thus, the photoconductive layer 103 (20μ thick) was formed. The waste gas w as discharged through the exhaust valve 16. Similarly, the intermediate layer 102 and surface layer 104 were formed.

EXAMPLE 13

A photoconductive layer 103 was formed from $SiF_4$, $Si_2H_6$ and $H_2$ by the conventional plasma CVD process using an apparatus as show in FIG. 2, the deposition space (A)1 of which was provided with a 13.56-MHz high-frequency electric discharge unit.

EXAMPLE 14

An electrophotographic image forming member in the drum form was prepared in the same manner as in Example 12, except that, for the formation of the photoconductive layer 103, an $SiF_4/(SiH_2)_5$ (vol ratio 1:1) mixture was fed as starting gas into the decomposition space (C)3, and a plasma reaction was caused to take place by applying a 13.56-MHz high-frequency electric field to the mixture instead of heating with the electric furnace so that a plasma state was produced. The activated species of various silanes and H were then introduced into the blowoff pipe 14. In this manner, a desired image forming member was obtained.

EXAMPLE 15

An electrophotographic image forming member in the drum form was prepared in the same manner as in Example 12, except that, for the formation of the photoconductive layer, an $(SiH_2)_4/(SiH_2)_5/H_2$ (vol. ratio 1:1:1) mixture was fed as starting gas into the decomposition space (C) and heated at 320° C. with the electric furnace to produce activated species of hydrogen and of silanes.

EXAMPLE 16

An electrophotographic image forming member in the drum form was prepared in the same manner as in Example 12, except that, for the formation of the photoconductive layer, $Si_2F_6$ as starting gas was fed into the decomposition space (B) and $(SiH_2)_5$ was fed as starting gas into the decomposition space (C) and heated at 300° C. with the electric furnace to produce activated species of silanes and of hydrogen.

EXAMPLE 17

An electrophotographic image forming member in the drum form was prepared in the same manner as in Example 12, except that, for the formation of the photoconductive layer, an $Si_2H_6/(SiH_2)_5$ (vol. ratio 1:1) mixture was fed as starting gas into the decomposition space (C) and heated at 310° C. with the electric furnace to produce activated species of silanes and of hydrogen.

The preparation conditions and performance of the electrophotographic image forming member in the drum form obtained in Examples 12, 13, 14, 15, 16 and 17 are shown in Table 3.

In Examples 12, 14, 15, 16 and 17, the intermediate layer 102 (2000 Å thick) was formed in such a manner that $SiF_4$ and $(SiH_2)_5/H_2/NO/B_2H_6$ (NO 2% and $B_2H_6$ 0.2% by vol. %) were introduced into the decomposition spaces (B) and (C), respectively, and activated species were produced with the respective excitation energies and introduced into the deposition space (A).

Also, in Example 13, the intermediate layer (2000 Å thick) was formed by the plasma CVD process employing a gas mixture of $(SiH_2)_5/H_2/NO/B_2H_6$ of the same composition as that in Examples 12 and 14.

In Examples 12, 14, 15, 16 and 17, the surface layer 104 (1000 Å thick) was formed in such a manner that $SiF_4$ was introduced into the decomposition space (B) while $(SiH_2)_5/CH_4/H_2$ was introduced in volume ratio of 10:100:50 into the decomposition space (c), and activated species were produced with the respective excitation thermal energies and introduced into the deposition space (A).

Also in Example 13, the plasma CVD process was carried out employing $(SiH_2)_5/CH_4/H_2$ of the same composition as above to form the surface layer 104 (1000 Å thick).

Electrophotographic image forming drums prepared in Examples 12, 13, 14, 15, 16 and 17 were evaluated in the same manner as in the case of Examples 1, 2, and 3. Results thereof are shown in Table 3 together with operational conditions in the formation of the photoconductive layers.

EXAMPLE 18

Using an apparatus as shown in FIG. 3, electrophotographic image forming members in the drum form were prepared continuously under similar conditions as in Example 12.

It has been confirmed that electrophotographic image forming members in the drum form having uniform and reproducible deposition films can be mass-produced at a low cost by controlling the temperatures of the deposition space and of the Al cylinders and the flow amounts of the activated species containing gas from the decomposition space (B), and of the activated species-containing gas from the decomposition space (C) into the deposition space (A).

According to the plasma CVD process, such treatment of a number of cylindrical substates in one deposition space would involve problems in the uniformity of the electric discharge and in synergistic effects of complicated production condition parameters, so that it has been impossible to produce electrophotographic image forming member in the drum form having uniform deposition films with high reproducibility.

TABLE 1

| Item | Example 1 | Example 2 | Example 3 |
|---|---|---|---|
| Decomp. space (B) | | | |
| Feed gas | $SiF_4$ | | $SiF_4$ |
| Decomp. temp. | 1100° C. | | 1100° C. |
| Main precursor | $SiF_2$* | | $SiF_2$* |
| Decomp. space (C) | | | |
| Feed gas (vol. ratio) | $SiH_4/H_2$ (1:1) | | $H_2$ |
| Decomp. energy | Heat, 600° C. | | Plasma RF 150 W |
| Activated species | $SiH_2$*, $SiH$*, $SiH_3$*, $H$*, $Si$* | | $H$* |
| Deposition space (A) | | | |
| Inflow from (B) | 200 SCCM | | 200 SCCM |
| Inflow from (C) | 100 SCCM | | 80 SCCM |
| Inflow from bomb | | $SiF_4$ 200 SCCM $SiH_4$ 100 SCCM $H_2$ 100 SCCM | |
| Pressure in (A) | 1.0 Torr | 1.0 Torr | 0.8 Toor |
| Substrate temp. | 280° C. | 260° C. | 280° C. |
| Temp. in (A) | 250° C. | | 250° C. |
| Rate of deposition | 15 Å/sec | 5 Å/sec | 12 Å/sec |
| Plasma RF | | 130 W | |

TABLE 1-continued

| Item | Example 1 | Example 2 | Example 3 |
|---|---|---|---|
| Thickness of photoconductive layer | 20μ | 17μ | 22μ |
| Average number of image defects per each of 10 drums | 2 | 15 | 3 |
| Deviation of charged potentials distributed in circumferential direction | ±10V | ±30V | ±8V |
| Deviation of charged potentials distributed in axial direction | ±15V | ±35V | ±15V |
| Nature of process | Process of this invention | Conventional plasma CVD process | Process of this invention |

TABLE 2

| Item | Example 6 | Example 7 | Example 8 | Example 9 | Example 11 |
|---|---|---|---|---|---|
| Decomp. space (B) | | | | | |
| Feed gas | SiF$_4$ | | SiF$_4$ | Si$_2$F$_6$ | SiF$_4$ |
| Decomp. temp. | 1100° C. | | 1100° C. | 800° C. | 1100° C. |
| Main precursor | SiF$_2$* | | SiF$_2$* | SiF$_2$* | SiF$_2$* |
| Decomp. space (C) | | | | | |
| Feed gas (vol. ratio) | Si$_2$H$_6$/H$_2$ (5:5) | | SiH$_4$/Si$_3$H$_8$/H$_2$ (10:5:5) | Si$_2$H$_6$/H$_2$ (5:5) | SiH$_4$/H$_2$ (1:1) |
| Decomp. energy | Heat 450° C. | | Plasma RF 100 W | Heat 450° C. | Heat 600° C. |
| Activated species | SiH$_2$*, SiH* Si*, SiH$_3$* Si$_2$H$_5$*, H* | | Similar to Example 6 | Similar to Example 6 | Similar to Example 6 |
| Decomp. space (A) | | | | | |
| Inflow from (B) | 150 SCCM | | 140 SCCM | 120 SCCM | 200 SCCM |
| Inflow from (C) | 80 SCCM | | 75 SCCM | 80 SCCM | 100 SCCM |
| Inflow from bomb | | SiF$_4$ 200 SCCM Si$_2$H$_6$ 100 SCCM H$_2$ 100 SCCM | | | |
| Pressure in (A) | 1.1 Torr | 1.2 Torr | 1.2 Torr | 1.0 Torr | 1.0 Torr |
| Substrate temp. | 270° C. | 260° C. | 270° C. | 270° C. | 280° C. |
| Temp. in (A) | 250° C. | | 250° C. | 250° C. | 250° C. |
| Rate of deposition | 20 Å/sec | 8 Å/sec | 21 Å/sec | 21 Å/sec | 15 Å/sec |
| Plasma RF | | 130 W | | | |
| Thickness of photoconductive layer | 21μ | 18μ | 22μ | 21μ | 20μ |
| Average number of image defects per each of 10 drums | 2 | 17 | 3 | 2 | 2 |
| Deviation of charged potentials distributed in circumferential direction | ±10V | ±30V | ±8V | ±11V | +10V |
| Deviation of charged potentials distributed in axial direction | ±13V | ±35V | ±15V | ±12V | ±15V |
| Nature of process | Process of this invention | Conventional plasma CVD process | Process of this invention | Process of this invention | Activated species of monosilane SiH$_4$ is used |

TABLE 3

| Item | Example 12 | Example 13 | Example 14 | Example 15 | Example 16 | Example 17 |
|---|---|---|---|---|---|---|
| Decomp. space (B) | | | | | | |
| Feed gas | SiF$_4$ | | SiF$_4$ | SiF$_4$ | Si$_2$F$_6$ | SiF$_4$ |
| Decomp. temp. | 1100° C. | | 1100° C. | 1100° C. | 1100° C. | 1100° C. |
| Main precursor | SiF$_2$* | | SiF$_2$* | SiF$_2$* | SiF$_2$* | SiF$_2$* |
| Decomp. space (C) | | | | | | |
| Feed gas (vol. ratio) | (SiH$_2$)$_5$ | | SiH$_4$/(SiH$_2$)$_5$ (1:1) | (SiH$_2$)$_4$/ (SiH$_2$)$_5$/H$_2$ | (SiH$_2$)$_5$ | Si$_2$H$_6$/(SiH$_2$)$_5$ (1:1) |

TABLE 3-continued

| Item | Example 12 | Example 13 | Example 14 | Example 15 | Example 16 | Example 17 |
|---|---|---|---|---|---|---|
| | | | (1:1:1) | | | |
| Decomp. energy | Heat 300° C. | | Plasma RF 150 W | Heat 320° C. | Heat 300° C. | Heat 310° C. |
| Activated species | $SiH_2*$, $H*$ $SiH_3*$, $SiH*$ $Si*$ | | Similar to Example 12 | Similar to Example 12 | Similar to Example 12 | Similar to Example 12 |
| Decomp. space (A) | | | | | | |
| Inflow from (B) | 150 SCCM | | 135 SCCM | 180 SCCM | 130 SCCM | 170 SCCM |
| Inflow from (C) | 70 SCCM | | 60 SCCM | 100 SCCM | 70 SCCM | 100 SCCM |
| Inflow bomb | | $SiF_4$ 200 SCCM $Si_2H_6$ 100 SCCM $H_2$ 100 SCCM | | | | |
| Pressure in (A) | 1.1 Torr | 1.0 Torr | 1.0 Torr | 1.2 Torr | 1.1 Torr | 1.2 Torr |
| Substrate temp. | 260° C. | 260° C. | 270° C. | 270° C. | 260° C. | 260° C. |
| Temp. in (A) | 250° C. | | 250° C. | 250° C. | 200° C. | 250° C. |
| Rate of deposition | 31 Å/sec | 5 Å/sec | 26 Å/sec | 33 Å/sec | 35 Å/sec | 35 Å/sec |
| Plasma RF | | 130 W | | | | |
| Thickness of photoconductive layer | 20μ | 17μ | 21μ | 20μ | 20μ | 20μ |
| Average number of image defects per each of 10 drums | 1 | 15 | 3 | 2 | 1 | 2 |
| Deviation of charged potential distributed in circumferential direction | ±10V | ±30V | ±8V | ±5V | ±8V | ±4V |
| Deviation of charged potential distributed in axial direction | ±12V | ±35V | ±14V | ±12V | ±13V | ±10V |
| Nature of process | Process of this invention | Conventional plasma CVD process | Process of this invention | Process of this invention | Process of this invention | Process of this invention |

What is claimed is:

1. A process for forming a deposited film suitable for use in semiconductor devices or electrophotographic photosensitive devices on a substrate in a deposition space (A), which comprises the steps of:

(a) heating the substrate in a heating chamber communicating with the deposition space (A);

(b) relocating the heated substrate to a deposition chamber having the deposition space (A);

(c) forming a deposited film on the substrate while heating and rotating the substrate, wherein the film is deposited without exposing a film-forming surface of the substrate to a plasma atmosphere by (c-1) forming a gaseous activated species or precursor from a starting material in each of a decomposition space (B) and another decomposition space (C), (c-2) separately introducing the activated species or precursor (i) formed in the decomposition space (B) and the activated species or precursor (ii) formed in the decomposition space (C) into the deposition space (A), the activated species or precursor (i) undergoing chemical interaction with the activated species or precursor (ii) to form the deposited film on the substrate, and (c-3) transferring the substrate through the deposition space (A), wherein the introducing step (c-2) of the activated species or precursor (i) and the activated species or precursor (ii) is conducted by introducing the activated species or precursor (i) from a plurality of first openings and introducing the activated species or precursor (ii) from a plurality of second openings, said first and second openings being offset from each other and spaced apart from the film-forming surface side of the substrate in the deposition space (A) along the transfer direction; and (d) cooling the substrate having the deposited film formed thereon in a cooling chamber communicating with the deposition space (A).

2. The process according to claim 1, wherein the starting material is selected from the group consisting of the compounds of the formulas:

$Si_nX_{2n+1}$ $(SiX_2)_n (n \geq 3)$ $Si_nHX_{2n+1}$ $Si_nH_2X_{2n}$ wherein n is an integral of at least 1 and X is selected from the group consisting of F, Cl, B, and I.

3. The process according to claim 1, wherein the starting material is selected from the group consisting of a higher straight chain silane compound and a cyclic silane compound.

4. The process according to claim 1, wherein the substrate is mounted on a movable stand when in the deposition space (A).

5. The process according to claim 4, wherein the movable stand is provided with rotation means.

6. The process according to claim 1, wherein a plurality of substrates are simultaneously located in the deposition space (A).

7. The process according to claim 1, wherein the process is carried out while transferring the substrate through the heating chamber, the deposition chamber, and the cooling chamber.

8. The process according to claim 1, wherein the substrate has a cylindrical shape.

9. The process according to claim 1, wherein the substrate has a cylindrical shape and the activated species or the precursor flows in an axial direction of the cylindrical shape.

10. The process according to claim 1, wherein exhaust means is connected to one side of the deposition space (A).

11. The process according to claim 1, wherein the ratio of the flow rate of the activated species or precursor from the decomposition space (B) to the flow rate of the activated species or precursor from the decomposition space (C) is within the range of 10:1 to 1:10.

12. The process according to claim 1, wherein the activated species or precursor is formed by utilizing any of electric discharge energy, thermal energy, or light energy.

13. The process according to claim 1, wherein the activated species or precursor formed includes a p-type or n-type impurity.

14. The process according to claim 1, wherein the precursor has a lifetime of at least 0.01 second.

15. The process according to claim 1, wherein the activated species has a lifetime of at most 10 seconds.

16. The process according to claim 1, wherein the ratio of the flow rate of the activated species or precursor from the decomposition space (B) to the flow rate of the activated species or precursor from the decomposition space (C) is within the range of 8:2 to 4:6.

* * * * *